United States Patent
Drewes et al.

(10) Patent No.: US 10,435,330 B2
(45) Date of Patent: Oct. 8, 2019

(54) METHOD FOR PRODUCING A CONNECTION BETWEEN TWO CERAMIC PARTS—IN PARTICULAR, OF PARTS OF A PRESSURE SENSOR

(71) Applicant: Endress + Hauser GmbH + Co. KG, Maulburg (DE)

(72) Inventors: Ulfert Drewes, Mullheim (DE); Nils Ponath, Lorrach (DE); Andreas Rossberg, Bad Sackingen (DE); Anh Tuan Tham, Berlin (DE)

(73) Assignee: ENDRESS+HAUSER SE+CO.KG, Maulburg (DE)

( * ) Notice: Subject to any disclaimer, the term of this patent is extended or adjusted under 35 U.S.C. 154(b) by 20 days.

(21) Appl. No.: 15/513,320

(22) PCT Filed: Aug. 19, 2015

(86) PCT No.: PCT/EP2015/069074
§ 371 (c)(1),
(2) Date: Mar. 22, 2017

(87) PCT Pub. No.: WO2016/045884
PCT Pub. Date: Mar. 31, 2016

(65) Prior Publication Data
US 2017/0305799 A1      Oct. 26, 2017

(30) Foreign Application Priority Data
Sep. 26, 2014   (DE) .................... 10 2014 113 958

(51) Int. Cl.
*B23K 31/02*     (2006.01)
*C04B 37/00*    (2006.01)
(Continued)

(52) U.S. Cl.
CPC ............ *C04B 37/006* (2013.01); *B23K 35/32* (2013.01); *C23C 14/042* (2013.01);
(Continued)

(58) Field of Classification Search
CPC .. B23K 1/00–1/206; B23K 3/00–3/087; B23K 35/0233; B23K 35/0238;
(Continued)

(56) References Cited

U.S. PATENT DOCUMENTS 2,857,663 A * 10/1958 Beggs ................... C04B 37/006
220/2.3 R
4,621,761 A * 11/1986 Hammond ........... B23K 35/004
228/124.1
(Continued)

FOREIGN PATENT DOCUMENTS

DE    10 2010 043119 A1    5/2012
EP         0 215554 A1    3/1987
(Continued)

*Primary Examiner* — Kiley S Stoner
(74) *Attorney, Agent, or Firm* — Bacon & Thomas, PLLC

(57) ABSTRACT

A method for producing a connection between two surfaces or surface sections of two ceramic parts comprises: provision of a first ceramic part and of a second ceramic part; provision of an active brazing solder material on at least one surface section of at least one of the ceramic parts; and heating the active brazing solder in a vacuum brazing process. The whole active brazing solder material is provided for connecting the first and the second ceramic part by a sputtering method, wherein at least one surface section of at least one of the ceramic parts, preferably of the two ceramic parts, is layered with a layer sequence of individual components of the active brazing solder material, wherein the average strength of the layers of an individual component of the active brazing solder is no more than 0.5%, in particular not more than 0.2%, preferably not more than (Continued)

0.1% and especially preferably not more than 0.05% of the strength of the joining region.

29 Claims, 3 Drawing Sheets

(51) Int. Cl.
| | | |
|---|---|---|
| *B23K 35/32* | (2006.01) | |
| *C23C 14/04* | (2006.01) | |
| *C23C 14/18* | (2006.01) | |
| *G01L 9/00* | (2006.01) | |
| *B23K 103/00* | (2006.01) | |

(52) U.S. Cl.
CPC .......... *C23C 14/185* (2013.01); *G01L 9/0048* (2013.01); *B23K 2103/52* (2018.08); *C04B 2235/6581* (2013.01); *C04B 2237/122* (2013.01); *C04B 2237/127* (2013.01); *C04B 2237/343* (2013.01); *C04B 2237/592* (2013.01); *C04B 2237/60* (2013.01); *C04B 2237/704* (2013.01); *C04B 2237/708* (2013.01); *C04B 2237/72* (2013.01)

(58) Field of Classification Search
CPC ....... B23K 35/24–35/327; B23K 35/32; B23K 2103/52; C04B 37/006; C04B 2237/60; C04B 2237/343; C04B 2235/6581; C04B 2237/592; C04B 2237/704; C04B 2237/708; C04B 2237/122; C04B 2237/72; C04B 2237/127; G01L 9/0048; C23C 14/042; C23C 14/185
USPC ............. 228/122.1, 245–255, 262.7–262.71, 228/262.3–262.31, 218–222
See application file for complete search history.

(56) References Cited

U.S. PATENT DOCUMENTS

| | | | | |
|---|---|---|---|---|
| 4,740,429 A * | 4/1988 | Tsuno | .................. | B23K 35/004 428/627 |
| 5,351,938 A * | 10/1994 | Hegner | ............... | B22D 11/0611 164/429 |
| 6,170,734 B1 * | 1/2001 | Lee | .......................... | B23K 1/19 228/120 |
| 6,315,188 B1 * | 11/2001 | Cadden | .................... | B23K 1/20 228/122.1 |
| 6,528,123 B1 * | 3/2003 | Cadden | ................. | C04B 37/006 427/250 |
| 8,882,917 B1 * | 11/2014 | Cheng | ..................... | C23C 14/54 118/715 |
| 8,915,142 B2 * | 12/2014 | Drewes | ................. | G01L 9/0042 228/121 |
| 2003/0087471 A1 * | 5/2003 | Shtein | ................... | C23C 14/042 438/82 |
| 2003/0230238 A1 * | 12/2003 | Papadimitrakopoulos | .................. | C23C 14/042 118/715 |
| 2006/0118047 A1 * | 6/2006 | Papadimitrakopoulos | .................. | C23C 14/042 118/726 |
| 2011/0249326 A1 * | 10/2011 | Villuendas Yuste | .... | F24S 70/20 359/360 |
| 2012/0063911 A1 * | 3/2012 | Bossmann | ........... | B23K 1/0018 416/241 B |
| 2012/0258322 A1 * | 10/2012 | Berlinger | .............. | C04B 37/006 428/450 |
| 2013/0029178 A1 * | 1/2013 | Chang | .................. | B23K 35/262 428/646 |
| 2013/0213138 A1 * | 8/2013 | Rossberg | ........... | B23K 35/0222 73/700 |
| 2013/0263670 A1 * | 10/2013 | Selders | ................. | G01L 9/0075 73/700 |
| 2015/0135844 A1 * | 5/2015 | Ponath | .................. | B23K 1/0008 73/724 |
| 2015/0298264 A1 * | 10/2015 | Rossberg | ............... | B23K 35/32 73/723 |
| 2015/0325649 A1 * | 11/2015 | Liu | .................... | H01L 21/02499 257/9 |
| 2016/0131546 A1 * | 5/2016 | Ponath | .................. | G01L 9/0075 73/718 |
| 2017/0348783 A1 * | 12/2017 | Ponath | ................. | B23K 35/286 |

FOREIGN PATENT DOCUMENTS

| | | | | |
|---|---|---|---|---|
| EP | 0490807 A2 | * | 6/1992 | ......... B22D 11/0611 |
| GB | 979811 A | * | 1/1965 | ........... C04B 37/026 |
| WO | WO-2012055989 A1 | * | 5/2012 | ......... B23K 35/0222 |
| WO | WO-2014072193 A1 | * | 5/2014 | ............. B23K 35/32 |

* cited by examiner

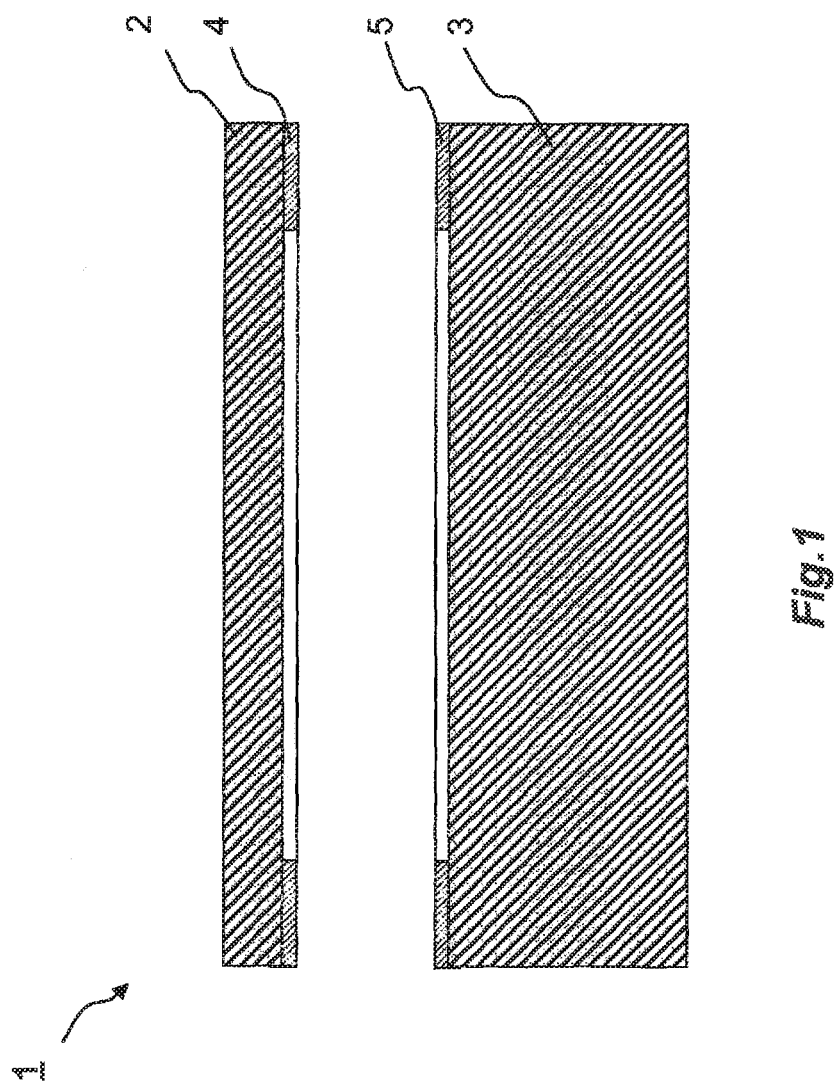

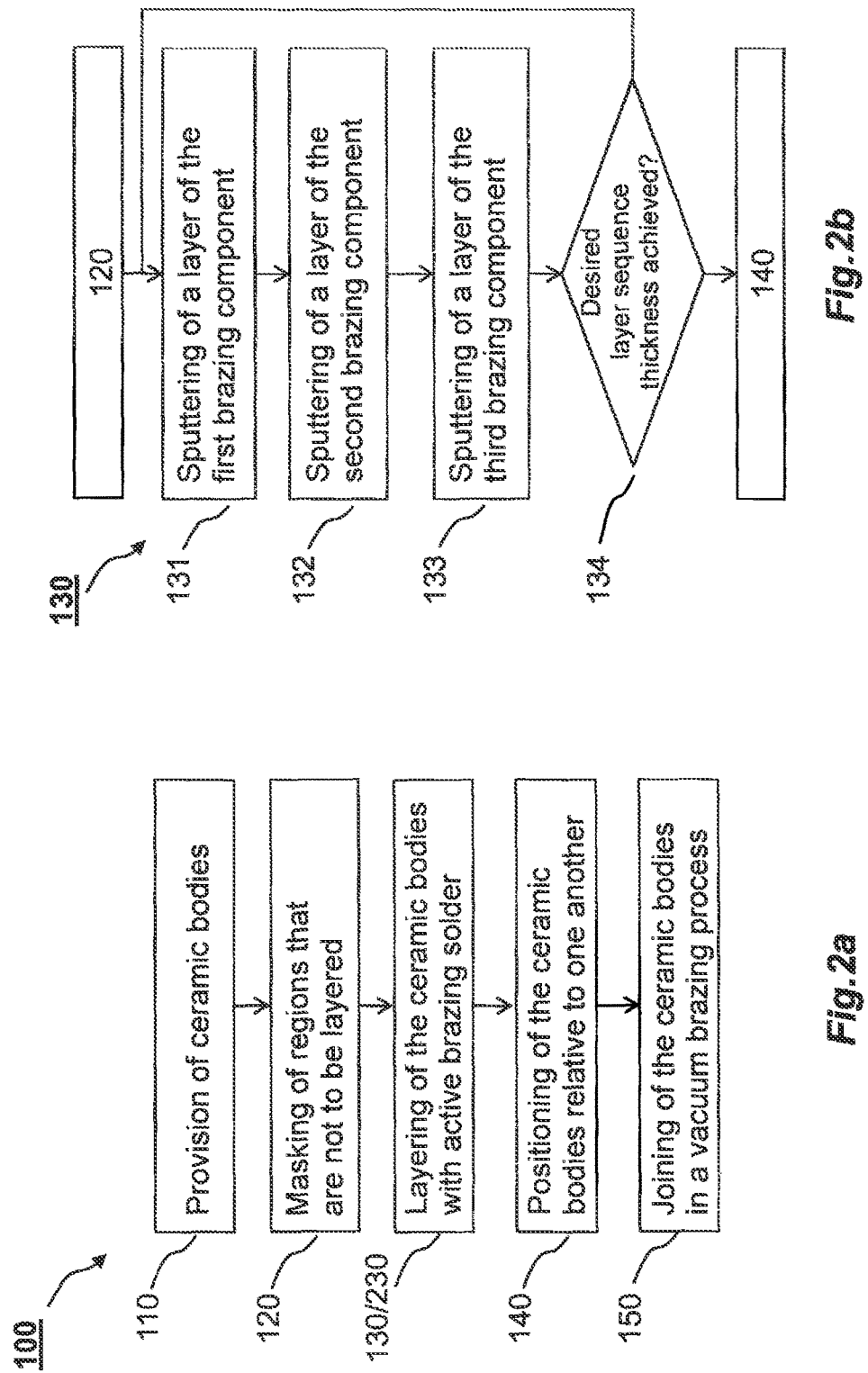

METHOD FOR PRODUCING A CONNECTION BETWEEN TWO CERAMIC PARTS—IN PARTICULAR, OF PARTS OF A PRESSURE SENSOR

TECHNICAL FIELD

The present invention relates to a method for producing a connection between two ceramic parts—especially, a ceramic pressure sensor.

BACKGROUND DISCUSSION

Ceramic pressure sensors comprise a base body and a measurement membrane, wherein the measurement membrane is joined by means of an active brazing solder. A suitable active brazing solder for joining ceramic parts made of corundum is, for example, a Zr—Ni—Ti alloy, since this is compatible with corundum in terms of its coefficient of thermal expansion.

Such an active brazing solder is disclosed in the European patent EP 0 490 807 B1. The European patent document EP 0 558 874 B1 discloses a method for producing rings made of such an active brazing solder; to connect measurement membrane and the base body, rings made of active brazing solder are placed as spacers between the two parts and fused in a high-vacuum brazing process, whereby a pressure-sealed and high-strength annular connection is created between the two ceramic parts. An alternative to the application of solder in the form of pre-manufactured rings is to provide the active brazing solder in a screen printing process. A paste of active brazing solder that is capable of being screen-printed, and a method for its production, are disclosed in the European patent document EP 0 988 919 A1.

However, the rings can only be produced in reproducible quality at a minimum thickness of approximately 30 μm, and the screen-printable paste also has grains, which lead as a result to joining regions having a minimum thickness of approximately 30 μm between the ceramic parts.

The need for a thinner joining region follows indirectly from the desire for miniaturization of pressure sensors, since—for example, given a ceramic pressure sensor having a capacitive transducer—the miniaturization leads to a reduction in size of the electrode surfaces of the capacitive transducer, which then is to be compensated for by a reduction of the clearance.

The disclosure document DE 10 2010 043 119 A1 discloses a method for producing a connection between two surfaces or surface segments of two ceramic parts, in which the entirety of the active brazing solder material is provided for connecting the first and second ceramic parts in such a manner that a surface segment of one or both ceramic parts is layered with the alloy of the active brazing solder and/or its components by means of a chemical vapor deposition. The chemical vapor deposition may thereby take place by means of sputtering or cathode sputtering, for example. The sputter target (which contains the alloy of the active brazing solder in the desired composition) may be produced by means of powder metallurgy, for example. However, the powder metallurgy production of such a target is complicated, especially when the targets contain active components. This then requires size reduction and powdering processes in a hydrogen atmosphere.

SUMMARY OF THE INVENTION

It is therefore an object of the present invention to provide an alternative method that overcomes the disadvantages of the prior art.

The object is achieved according to the invention by the method for producing a connection between two surfaces or surface segments of two ceramic parts which includes:
provision of a first ceramic part and a second ceramic part;
provision of an active brazing solder material on at least one surface segment of at least one of the ceramic parts; and
heating the active brazing solder in a vacuum brazing process,
wherein, according to the invention, the entirety of the active brazing solder material for connecting the first and second ceramic parts is provided via a sputtering method, wherein at least one surface segment of at least one of the ceramic parts—preferably, of both ceramic parts—is layered with a layer sequence of the individual components of the active brazing solder material, wherein the mean thickness of the layers of an individual component of the active brazing solder is no more than 0.5%—in particular, not more than 0.2%, preferably not more than 0.1%, and especially preferably not more than 0.05%—of the thickness of the joining region.

In a development of the invention, the active brazing solder in the joining region has a thickness of no more than 20 μm—especially no more than 15 μm, preferably no more than 12 μm, and particularly preferably no more than 10 μm.

According to a development of the invention, the individual layers of the component have a thickness of no more than 10 nm—especially no more than 5 nm, preferably no more than 2 nm, and particularly preferably no more than 1 nm.

In a development of the invention, the mean layer thickness of the layers of a component, and/or their frequency, is a function of the proportion of the component in the alloy.

In a development of the invention, the mean layer thickness of the layers of a component [sic] and proportional to the proportion of the component in the alloy.

In a development of the invention, the components are respectively sputtered from pure sputter targets that respectively comprise exclusively the material of the component.

In a development of the invention, the thickness of the individual layers is controlled over time as a function of the deposition rate of the individual components.

In a development of the invention, the deposition rate is monitored by means of a quartz crystal microbalance.

In a development of the invention, a first layer sequence of a first composition of the components of the active brazing solder is first deposited on the at least one surface, wherein a second layer sequence of a second composition of the active brazing solder follows the first layer sequence.

In a development of the invention, the first layer sequence has a thickness that is no more than 10%—especially, no more than 5%—of the thickness of the joining region.

In a development of the invention, the first composition has a melting point that is not less than 100 K° lower than the melting point of the second composition.

In a development of the invention, the second composition has a coefficient of thermal expansion that has a smaller difference from the coefficient of thermal expansion of the ceramic material than the coefficient of thermal expansion of the first composition.

According to a development, the first layer with which at least one the joining region partners is layered has an active component of the active brazing solder.

According to a development of the invention, the active brazing solder comprises a Zr—Ni—Ti alloy, wherein the at least one active component especially comprises titanium or zirconium.

According to a development of the invention, the first and/or second ceramic part comprises corundum.

According to a development of the invention, the first ceramic part and the second ceramic part are connected so as to be pressure-sealed along a first annular joining region which encloses a cavity between the first ceramic part and the second ceramic part, wherein the active brazing solder is deposited on at least one annular surface segment of a ceramic part, wherein a region enclosed by the annular surface segment is masked during the deposition of the active brazing solder.

In a development of the invention, the brazing process is a vacuum brazing process or a brazing process under inert gas.

In a development of the invention, the first ceramic part comprises a base body of the pressure sensor, wherein the second ceramic part comprises the measurement membrane of the pressure sensor, and wherein the measurement membrane is connected so as to be pressure-sealed with the base body along an annular joining region which has the active brazing solder.

In a development of the invention, the pressure sensor is a differential pressure sensor which has a measurement membrane between two base bodies or one base body between two measurement membranes, which two base bodies or two measurement membranes are to be joined with one another, wherein the active brazing solder material is respectively provided in the same manner for the two joining regions between the measurement membrane and the counter-bodies or the measurement membranes and the counter-body.

BRIEF DESCRIPTION OF THE DRAWINGS

The invention will now be explained on the basis of the exemplary embodiment shown in the drawings.

Illustrated in the drawings are:

FIG. 1: which shows components of a ceramic pressure sensor which are joined by means of the method according to the invention;

FIG. 2a: is a flow diagram of an exemplary embodiment of the method according to the invention; and FIG. 2b: is a more detailed flow diagram for implementing a method step of the exemplary embodiment from FIG. 2a.

FIG. 2c: is a more detailed flow diagram for implementing an alternative method step to the method step from FIG. 2b of the exemplary embodiment from FIG. 2a.

DETAILED DISCUSSION IN CONJUNCTION WITH THE DRAWINGS

Figure 2C:
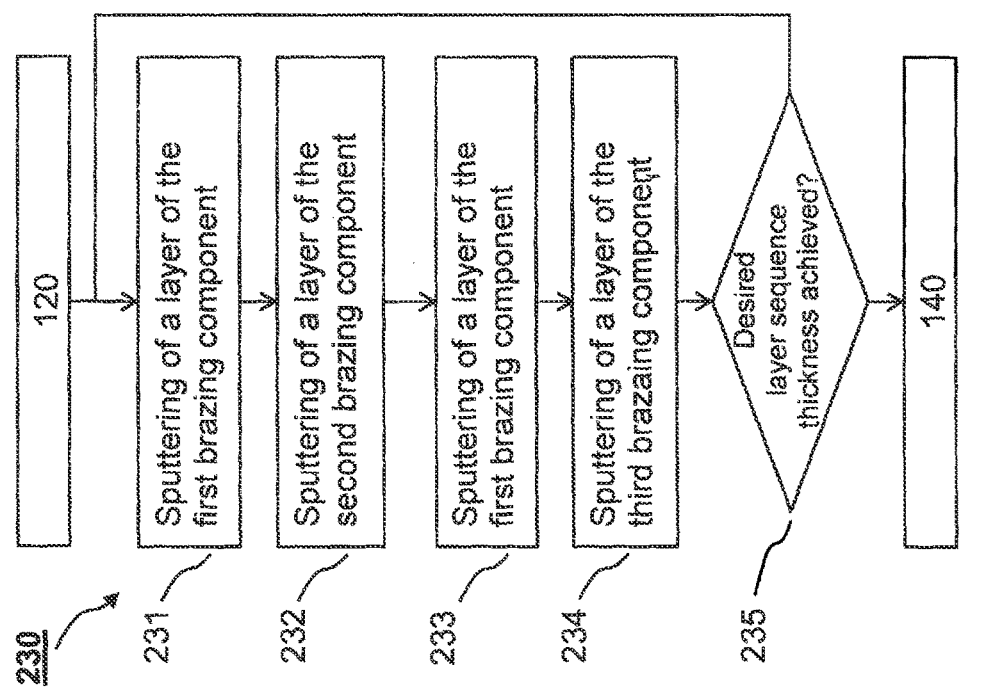

The components of a ceramic pressure sensor 1 that are depicted in FIG. 1 comprise a circular, disc-shaped measurement membrane 2 of a circular, disc-shaped base body 3 which comprise corundum. The measurement membrane may especially comprise highly pure corundum with a purity of better than 99.98%. Depending upon the embodiment, the measurement membrane 1 and the base body 2 have a diameter of approximately 15 to 25 mm, for example. For example, the material thickness of the measurement membrane 2 is 100 µm to 2 mm, whereas the base body has a material thickness of a few mm. However, the cited dimensions are not a value significant to the invention, and may be chosen according to the requirements of the measurement technology or other boundary conditions, for example. The measurement membrane 1 and the base body 2 are to be connected so as to be pressure-sealed by means of a Zr—Ni—Ti active brazing solder in a high-vacuum brazing process.

For this, the faces to be joined of the measurement membrane 2 and of the base body 3 are respectively first masked, except for an annular border region, in order to then prepare the active brazing solder for the joining region in the annular border region by means of chemical vapor deposition.

After the complete deposition of the active brazing solder to form the joining region, the measurement membrane 2 and the base body 3 with the active brazing solder layers are placed one atop the other and, in a vacuum brazing process, connected with one another so as to be pressure-sealed.

Electrodes for a capacitive transducer of the pressure sensor are preferably prepared before the deposition of the active brazing solder (not shown here). This may likewise take place by means of chemical vapor deposition in a sputtering process. For example, Ta, which is deposited in a thickness of, for example, 0.1 to 0.2 µm, is suitable as an electrode material. For example, a preferred electrode arrangement may enable a formation of a differential capacitor, for which a central measurement electrode in the shape of a circular area and an annular reference electrode of the same capacitance, surrounding said measurement electrode, are deposited on the facing side of the base body in the region to be surrounded by the annular joining region. The measurement electrode, the reference electrode, and the joining region are preferably electrically isolated from one another in the finished pressure sensor. A counter-electrode is preferably prepared over the entire surface of the membrane, which counter-electrode is preferably in galvanic contact with the joining region in the finished sensor.

An exemplary embodiment of a method for producing a connection between ceramic bodies, e.g., the above components of a pressure sensor, is now explained using FIGS. 2a through 2b. FIG. 2a, in this connection, initially shows, in general, a method 100 known per se, with a sequence of steps which includes the provision 110 of ceramic bodies, masking 120 of regions that are not to be layered, layering 130 of the ceramic bodies with active brazing solder, positioning 140 of the ceramic bodies relative to one another, and joining 150 the ceramic bodies in a vacuum brazing process. The characteristic feature of the present invention relates to the layering 130, which is presented in detail in FIG. 2b. According to this, the layering 130 is achieved via a repeated sequence of sputtering steps 131, 132, 133 until a desired layer sequence thickness of, for example, 5 µm is achieved, wherein the maximum individual layer thickness is approximately 5 nm. The layers of a first component may thus have a layer thickness of 1 nm, for example, the layers of a second component may have a thickness of 2 nm, and the layers of a third component may have a thickness of 5 nm, for example.

In sputtering, the thickness of the individual layers is controlled via the component-specific electrical power and the sputtering time, wherein the atomic mass and the density of the component at a given power are involved in the deposition rate.

However, given the same frequency of the layers of the individual components, there are necessarily alloys that can no longer be reasonably represented, due to a variation of the layer thickness. Therefore, for the components $c_{Zr}$, $c_{Ni}$, $c_{Ti}$ of a preferred Zr—Ni—Ti alloy, it applies that (in atomic %): $61 < c_{Zr} < 63.5$; $21.5 < c_{Ni} < 24$ and $14.5 < c_{Ti} < 15.5$.

Taking into account the respective atomic masses and solid densities of the pure materials, the following layer thickness ratios therefore result for a composition (in atomic %) with $c_{Zr}=62$; $c_{Ni}=23$ and $d_{Ti}=15$:

$$d_{Zr}=5 \text{ nm}; d_{Ni}=1.0 \text{ nm and } d_{Ti}=0.4 \text{ nm}$$

In order to achieve a greater thickness of the titanium layer, the frequency of the zirconium layer may be doubled. The layer sequence is then . . . Ti, Zr, Ni, Zr, Ti, Zr, Ni, Zr, . . . with the following layer thickness ratios:

$$d_{Zr}=5 \text{ nm}; d_{Ni}=2.0 \text{ nm and } d_{Ti}=0.8 \text{ nm}$$

A corresponding sub-process for the layering step 230 is depicted in FIG. 2c, wherein Zr corresponds to the first component, while Ni and Ti form the second or third component.

In order to achieve an efficient deposition rate with sufficiently good control of the rate, a sputtering system with a high-power magnetron is preferably used. With this, deposition rates between approximately 0.2 nm/s and approximately 2 nm/s can be set in a controlled manner. For the deposition of 5 μm, 2500 s (thus, nearly 42 minutes) are required, given a deposition rate of 2 nm/s.

The invention claimed is:

1. A method for producing a connection between two surfaces or surface segments of two ceramic parts comprising:
   providing a first ceramic part and a second ceramic part;
   providing an active brazing solder material, comprising a Zr—Ni—Ti alloy, on at least one surface segment of at least one of the ceramic parts; and
   heating the active brazing solder in a vacuum brazing process, wherein:
   the entirety of the active brazing solder material for connecting the first and second ceramic parts is provided via a sputtering method, wherein at least one surface segment of at least one of the ceramic parts is layered with a layer sequence of individual components of the active brazing solder material, wherein Zr, Ni and Ti each form an individual component; and
   the mean thickness of the layers of an individual component of the active brazing solder is no more than 0.5% of the thickness of the joining region.

2. The method according to claim 1, wherein:
the active brazing solder in the joining region has a thickness of no more than 20 μm.

3. The method according to claim 1, wherein:
the individual layers of the component have a thickness of no more than 10 nm.

4. The method according to claim 1, wherein:
the mean layer thickness of the layers of a component, and/or their frequency, is a function of the proportion of the component in the alloy.

5. The method according to claim 1, wherein:
the mean layer thickness of the layers of a component is proportional to the proportion of the component in the alloy.

6. The method according to claim 1, wherein:
the components are respectively sputtered from pure sputter targets that respectively comprise exclusively the material of the component.

7. The method according to claim 1, wherein:
the thickness of the individual layers is controlled over the respective layering time as a function of the deposition rate of the individual components.

8. The method according to claim 1, wherein:
a deposition rate of the individual components is respectively monitored by means of a quartz crystal microbalance.

9. The method according to claim 1, wherein:
a first layer sequence of a first composition of the components of the active brazing solder is first deposited on the at least one surface;
a second layer sequence of a second composition of the components of the active brazing solder follows the first layer sequence.

10. The method according to claim 9, wherein:
the second composition has a coefficient of thermal expansion that has a smaller difference from the coefficient of thermal expansion of the ceramic material than the coefficient of thermal expansion of the first composition.

11. The method according to claim 9, wherein:
the first layer sequence has a thickness that is no more than 10% of the thickness of the joining region.

12. The method according to claim 1, wherein:
a first layer, with which at least one of the joining partners is layered, has an active component of the active brazing solder.

13. The method according to claim 1, wherein:
the at least one active component especially comprises titanium or zirconium.

14. The method according to claim 1, wherein:
the first and/or second ceramic part comprise corundum.

15. The method according to claim 1, wherein:
the first ceramic part and the second ceramic part are connected so as to be pressure-sealed along an annular joining region which encloses a cavity between the first ceramic part and the second ceramic part;
the active brazing solder is deposited on at least one annular surface segment of a ceramic part; and
a region enclosed by the annular surface segment is masked during the deposition of the active brazing solder.

16. The method according to claim 1, wherein:
the brazing process includes a vacuum brazing process or a brazing process under inert gas.

17. The method according to claim 1, wherein:
the first ceramic part comprises a base body of a pressure sensor;
the second ceramic part comprises a measurement membrane of the pressure sensor; and
the measurement membrane is connected with the base body so as to be pressure-sealed along an annular joining region which has the active brazing solder.

18. The method according to claim 15, wherein:
the pressure sensor is a differential pressure sensor which has a measurement membrane between two base bodies or one base body between two measurement membranes, which two base bodies or two measurement membranes are to be joined with one another; and
the active brazing solder material is respectively provided in a same manner for the two joining regions between the measurement membrane and the counter-bodies or the measurement membranes and the counter-body.

19. The method according to claim 1, wherein:
the mean thickness of the layers of an individual component of the active brazing solder is no more than 0.2% of the thickness of the joining region.

20. The method according to claim 1, wherein:
the mean thickness of the layers of an individual component of the active brazing solder is no more than 0.1% of the thickness of the joining region.

21. The method according to claim 1, wherein:
the mean thickness of the layers of an individual component of the active brazing solder is no more than 0.05% of the thickness of the joining region.

22. The method according to claim 1, wherein:
the active brazing solder in the joining region has a thickness of no more than 15 μm.

23. The method according to claim 1, wherein:
the active brazing solder in the joining region has a thickness of no more than 12 μm.

24. The method according to claim 1, wherein:
the active brazing solder in the joining region has a thickness of no more than 10 μm.

25. The method according to claim 1, wherein:
the individual layers of the component have a thickness of no more than 5 nm.

26. The method according to claim 1, wherein:
the individual layers of the component have a thickness of no more than 2 nm.

27. The method according to claim 1, wherein:
the individual layers of the component have a thickness of no more than 1 nm.

28. The method according to claim 9, wherein:
the first composition has a melting point that is not less than 100 K lower than the melting point of the second composition.

29. The method according to claim 9, wherein:
the first layer sequence has a thickness that is no more than 5% of the thickness of the joining region.

* * * * *